United States Patent [19]

Uken et al.

[11] Patent Number: 4,690,831

[45] Date of Patent: Sep. 1, 1987

[54] PROTECTIVE ARTICLE

[75] Inventors: William D. Uken, Fremont; Robert S. Dubrow, Redwood City; Carib Nelson, Palo Alto; Catherine A. Dittmer, Mountain View, all of Calif.

[73] Assignee: Raychem Corp., Menlo Park, Calif.

[21] Appl. No.: 875,802

[22] Filed: Jun. 18, 1986

Related U.S. Application Data

[60] Division of Ser. No. 730,699, May 2, 1985, Pat. No. 4,643,924, which is a continuation-in-part of Ser. No. 715,789, Mar. 25, 1985, abandoned, which is a continuation-in-part of Ser. No. 507,435, Jun. 23, 1983, abandoned.

[51] Int. Cl.$^4$ .................................................. B05D 3/06
[52] U.S. Cl. ....................................... 427/44; 156/224; 264/552; 427/54.1; 427/350; 427/358
[58] Field of Search ............... 427/44, 54.1, 350, 358; 156/196, 199, 221, 224; 264/552, 553

[56] References Cited

U.S. PATENT DOCUMENTS

| | | | |
|---|---|---|---|
| Re. 30,321 | 7/1980 | Brauer et al. | 528/361 |
| Re. 31,389 | 9/1983 | Brauer et al. | 210/321.3 |
| 3,040,385 | 6/1962 | Folta | 156/224 |
| 3,187,088 | 6/1965 | Warner | 174/91 |
| 3,228,820 | 1/1966 | Samson | 428/247 |
| 3,427,393 | 2/1969 | Masterson | 174/23 C |
| 3,619,481 | 11/1971 | Smith | 174/138 F |
| 3,649,436 | 3/1972 | Buese | 428/317.3 |
| 3,678,174 | 7/1972 | Ganzhorn | 174/84 R |
| 3,718,619 | 2/1973 | Rustad | 528/63 |
| 3,731,258 | 5/1973 | Spicer | 339/48 |
| 3,801,532 | 4/1974 | Olstowski | 524/792 |
| 3,897,129 | 7/1975 | Farrar | 339/116 C |
| 3,916,082 | 10/1975 | Gillemot | 174/41 |
| 3,928,704 | 12/1975 | Heidingsfeld et al. | 428/904 |
| 3,929,949 | 12/1975 | Day et al. | 428/904 |
| 3,933,559 | 1/1976 | Watanabe | 156/224 |
| 3,938,725 | 2/1976 | Hardwick et al. | 156/224 |
| 3,985,951 | 10/1976 | Harris | 174/138 F |
| 4,025,717 | 5/1977 | Whittingham | 174/88 C |
| 4,026,747 | 5/1977 | De Lorean et al. | 428/322.7 |
| 4,168,258 | 9/1979 | Brauer et al. | 524/140 |
| 4,171,998 | 10/1979 | Brauer et al. | 156/48 |
| 4,176,239 | 11/1979 | Brauer et al. | 174/23 C |
| 4,219,598 | 8/1980 | Noma et al. | 428/260 |
| 4,231,986 | 11/1980 | Brauer et al. | 264/272 |
| 4,277,298 | 7/1981 | L'Allemand | 156/199 |
| 4,281,210 | 7/1981 | Brauer et al. | 174/23 C |
| 4,297,155 | 10/1981 | Jervis | 156/86 |
| 4,361,457 | 11/1982 | Keeler et al. | 156/224 |
| 4,369,284 | 1/1983 | Chen | 524/476 |
| 4,424,100 | 1/1984 | McCarty et al. | 427/44 |
| 4,504,699 | 3/1985 | Dones | 174/84 R |
| 4,549,337 | 10/1985 | Newell et al. | 264/552 |

FOREIGN PATENT DOCUMENTS 2070658  9/1981  United Kingdom ............... 428/904

*Primary Examiner*—John H. Newsome
*Attorney, Agent, or Firm*—Dennis E. Kovach; Herbert G. Burkard

[57] ABSTRACT

An article for protecting a substrate includes a preshaped member having a shape similar to that of the substrate being protected, the article having a thin layer of gel disposed in intimate contact with an inner surface of the member such that the gel is disposed in intimate contact with the substrate when the member is disposed therearound. Preferably, the gel comprises an open looped three-dimensional network, the gel being relatively soft, elastic, and having an ultimate elongation in excess of 100%.

18 Claims, 10 Drawing Figures

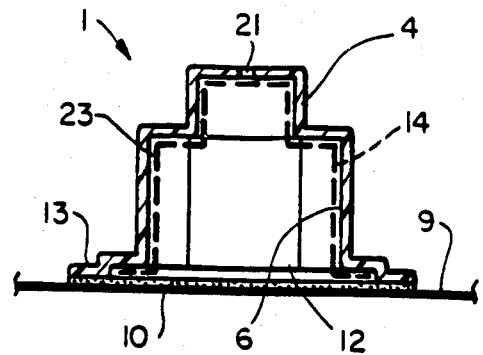
FIG__1
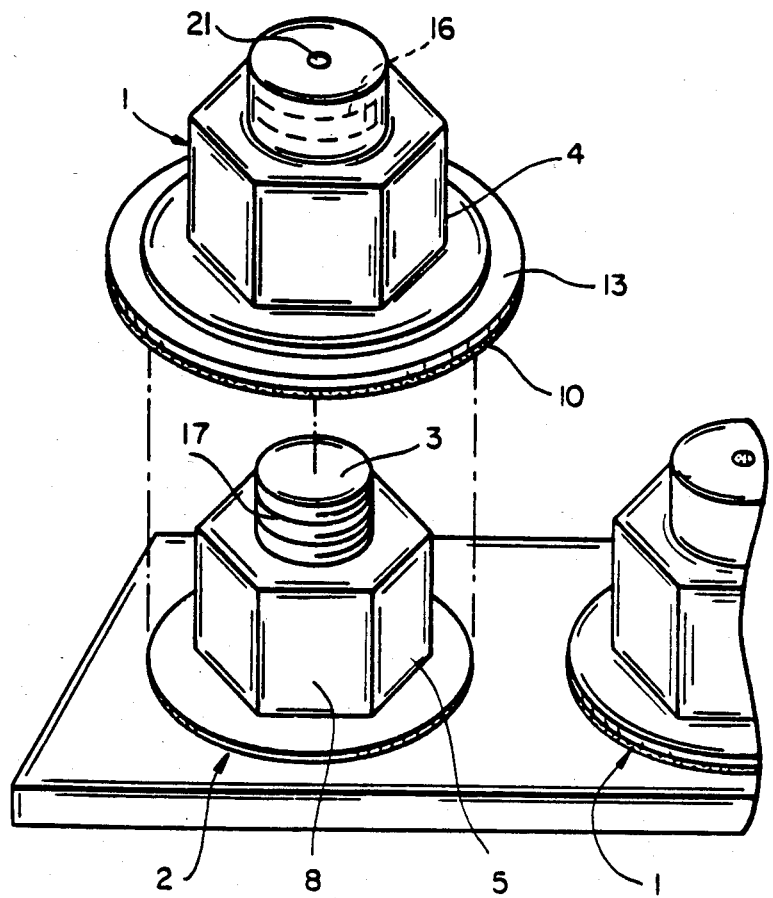
FIG__2

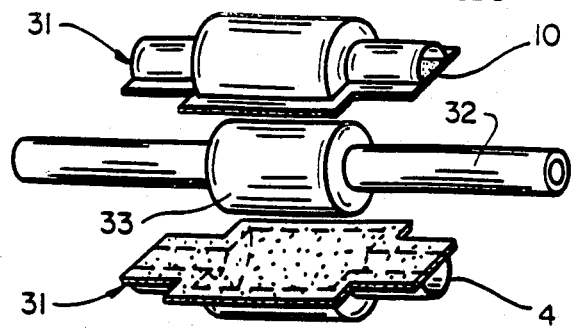
FIG_3
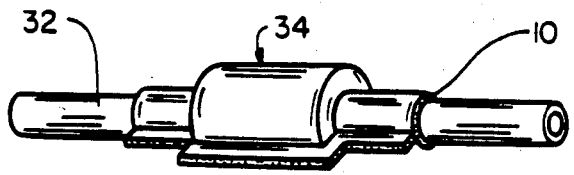
FIG_4
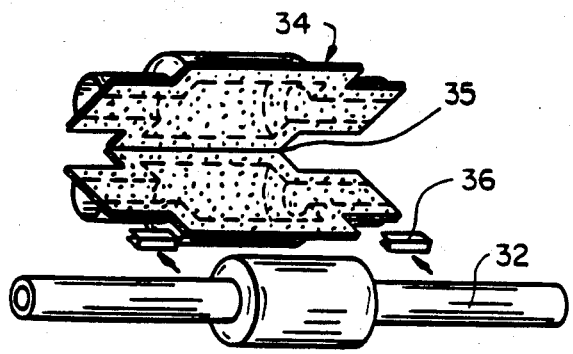
FIG_5
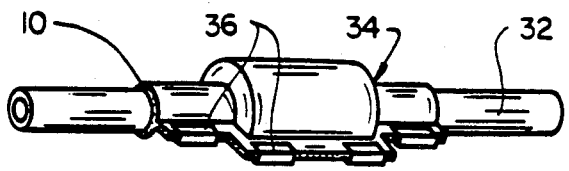
FIG_6

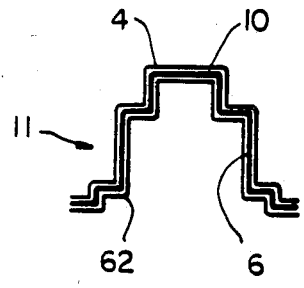
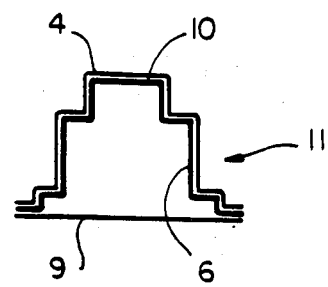
FIG_7A    FIG_7B
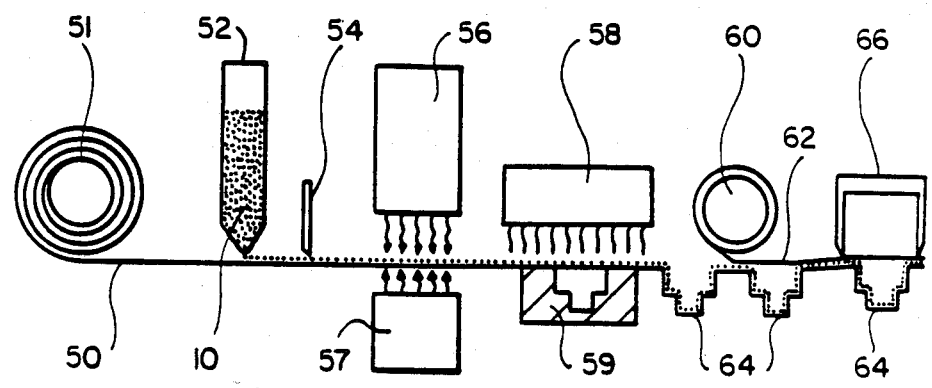
FIG_8
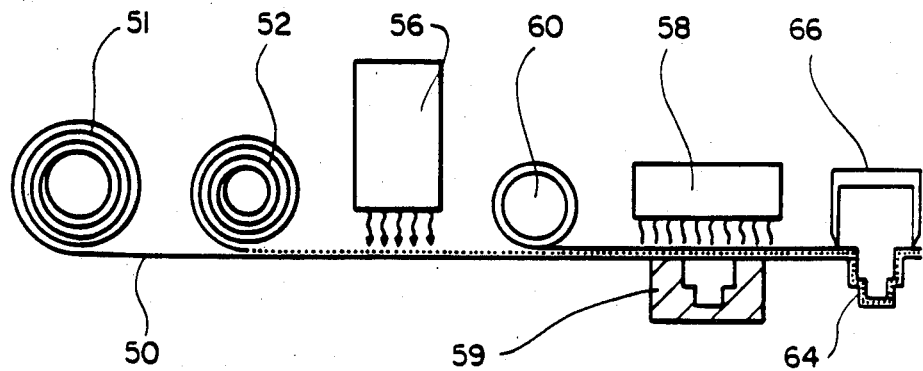
FIG_9

PROTECTIVE ARTICLE

CROSS-REFERENCE TO RELATED APPLICATIONS

This application is a division of copending application Ser. No. 730,699, filed May 2, 1985, now U.S. Pat. No. 4,643,924, which is a continuation-in-part of U.S. application Ser. No. 715,789 filed March 25, 1985, now abandoned, which was a continuation-in-part of U.S. application Ser. No. 507,435 filed June 23, 1983, now abandoned, the disclosures of which are incorporated herein by reference.

BACKGROUND OF THE INVENTION

The present invention relates to an article for protecting a substrate from environmental effects such as corrosion, electrical currents, etc.

Various ways have been proposed in the prior art for protecting a substrate from adverse environmental effects. For example, in the case of nuts and bolts, in very severe environments such as those encountered on ocean-traversing vessels, multiple layers of paint are often disposed on exposed portions of the nuts and bolts for protecting them from corrosion. As an alternative to paint, various types of greases have also been utilized in many circumstances for protecting substrates from adverse environmental contaminants, such as water, and for electrical insulation protection, and also for insulating metal substrates. These methods are disadvantageous in that insufficient corrosion protection is afforded, reentry is difficult, the protection lasts for a relatively short period of time, they are labor intensive, and relatively expensive.

U.S. Ser. No. 434,001 filed Oct. 1, 1982, now abandoned; 504,000 filed June 13, 1983, now Pat. No. 4,634,207; 507,433 filed June 23,1983, now abandoned, and 646,555 filed Oct. 31, 1984, all assigned to the assignee of the present invention, discloses various containers which are substantially filled with gel material, the containers subsequently being disposed in contact with a substrate subsequent to curing the gel. Though these gel filled containers are quite effective in protecting substrates, they are disadvantageous in that they are relatively inefficient since a relatively large amount of gel is required per substrate to be protected.

SUMMARY OF THE INVENTION

Accordingly, it is an object of the invention to eliminate the above-noted drawbacks and to provide an article for protecting a substrate which is relatively inexpensive to produce, is easy to install over the substrate, lasts a relatively long period of time, and can be made easily reenterable, if desired.

These and other objects are achieved by articles, and methods of producing such articles, the articles including a preshaped member which has an internal surface shape which is similar to an outer surface shape of the substrate to be protected. In one embodiment, an open surface defined by the preshaped member has a flexible gel disposed thereover, the flexible gel comprising a relatively thin layer of gel, such that when the member is disposed over the substrate, the gel is deformed over and around an outer surface of the substrate and is in intimate contact therewith. According to another embodiment of the invention, the thin layer of flexible gel is disposed into intimate contact with substantially the entire inner surface of the preshaped member. With this embodiment, since the internal surface shape of the member is similar to the outer surface shape of the substrate, when the member is disposed over the substrate, again the gel is in intimate contact therewith. Accordingly, both embodiments utilize very small amounts of gel per substrate to be protected. The gel preferably comprises a three-dimensional open cell network, is elastic, has finite elongation, preferably in excess of 200%, and has a cone penetration between 150 and 350 ($10^{-1}$mm).

According to a method of the invention for producing the article having the gel disposed into intimate contact with the internal surface of the member, one embodiment of the method comprises continuously disposing a gel onto a backing and subsequently deforming the gel and backing using a vacuum thermoforming process whereby the backing and gel are heated, and deformed such that the gel is stretched upon deformation of the backing, the backing being chosen from a material which has sufficient structural strength upon being cooled to keep the gel in its expanded deformed state and in intimate contact with the backing. Subsequent to deforming the backing, a die station is used to separate the deformed backing having gel thereon, which then comprises an article of the invention.

According to one preferred embodiment, the gel is disposed onto the backing in a non-cured state, a thickness of the gel is controlled using a doctor blade, the gel is then cured using either chemical means or radiation, the gel is secured to the backing, again using either radiation or chemical means such as an adhesive, and subsequently the cured gel and backing are deformed. According to another preferred embodiment of a method of the invention, a pre-cured gel is disposed on the backing, and the pre-cured gel is secured to the backing using either radiation or chemical means prior to deforming the cured gel and backing.

Such an article provides an excellent means for protecting irregularly shaped articles using a minimum amount of gel in an efficient manner.

BRIEF DESCRIPTION OF THE DRAWINGS

FIG. 1 is a cross-sectional view of a first preferred embodiment of the invention;

FIG. 2 is a full perspective view of the article of Figure 1 disposed in close proximity to a substrate to be protected, and a partial view of an installed article;

FIGS. 3-6 illustrate further embodiments of the invention;

FIGS. 7a and 7b illustrate further preferred embodiments of articles of the invention; and FIGS. 8-9 illustrate alternative exemplary embodiments for making the articles of FIGS. 7a and 7b.

DESCRIPTION OF THE PREFERRED EMBODIMENTS

FIG. 1 illustrates a cross-sectional view of an article 1 constructed according to a first preferred embodiment of the invention with FIG. 2 illustrating, on the left, a perspective view of the article of FIG. 1 in close proximity to a substrate 2 to be protected, and on the right, the article as installed on the substrate. In the embodiment illustrated, the substrate 2 is a bolt 3 having a nut 5 therearound, and the article 1 is generically termed a bolt cover. However, it should be appreciated that the substrate 2 can comprise any kind of element which requires some sort of protection from the environment, such as protection from corrosion, protection from electrical discharge, etc., and that the article 1 comprises any member suitable for protecting such a substrate. The invention is most suitable for use with substrates having irregular shapes, though the invention is also suitable for protecting substrates having uniform shapes as well. Though the invention is described with reference to a few exemplary embodiments, in particular a few specific shaped substrates, it should be understood that the invention is applicable to protecting numerous other types and shapes of substrates as well even though the vast majority of substrates in existence which require some kind of protection are not illustrated in the drawings.

The article 1 includes a preshaped member 4 which has an internal surface 6 which has a shape similar to an external surface of the substrate 2 which is to be protected. In particular, the shapes of the surfaces 6, 8 are substantially the same, e.g., most preferably mirror images of one another. The member 4 can be shaped so as to form a tight fit about the substrate 2 when installed, and it is even possible to form the member 4 so as to be slightly smaller in size than the substrate 2 which causes the member 4 to elastically stretch about the substrate when installed providing excellent adhesion.

A protective flexible gel 10 is disposed across an open side 12 defined by the shape of the preshaped member 4, and is secured to the preshaped member 4 at a periphery 13 by any appropriate means such as, for example, by an adhesive or by a mechanical clamp. The gel is preferably one of the types described in U.S. Serial No. 434,011 filed Oct. 12, 1982; Ser. No. 504,000 filed June 13, 1983; Ser. No. 507,433 filed June 23, 1983; and Ser. No. 646,555 filed Oct. 31, 1983; all cited above and assigned to the assignee of the present invention. In particular, the gel can comprise a urethane, a silicone, or a nonsilicone liquid rubber with low or no unsaturation which has been crosslinked, with silicone being a preferred embodiment. The gel is a material having an open loop three-dimensional network such that it is elastic and has a finite amount of elongation, and is relatively soft. A preferred embodiment is to use a gel having a cone penetration between 150 and 350 ($10^{-1}$ mm), and an ultimate elongation of at least 100%, as measured in accordance with American National Standard Designation ASTM-D217 and ASTM-D638, respectively. Preferably, the cone penetration is between 200 and 300 ($10^{-1}$ mm), and more preferably between 260 and 280 ($10-1$ mm). A release sheet 9 is disposed over the gel 10, the sheet keeping the gel 10 clean and being releasable therefrom prior to installing the article on the substrate.

The ultimate elongation is most preferably in excess of 200%, and most preferably is at least 400%. In addition, as noted, the gel is also elastic such that it tends to resist deformation and generates a restoration force upon being deformed.

Furthermore, another preferred embodiment is to contain the gel 10 in a three-dimensional foam network, such as that disclosed in parent application U.S. Ser. No. 507,435 filed June 23, 1983, cited above. Specifically, the foam network is characterized by a flexible matrix having a plurality of open interstices having an average volume of less than 0.01 inch$^3$, the gel including a plurality of interconnected segments which lie within the interstices of the matrix, the matrix and the gel being such that when they are stretched, the matrix reaches its ultimate elongation before the gel reaches it ultimate elongation. The thickness of the gel and the matrix need not be large, e.g. it can be less than 10 mm, preferably less than 5 mm, and more preferably less than 1 mm. One important function of the matrix is to provide tensile and shear strength for the gel. Accordingly, the matrix, though desirable, is not necessary so long as care is taken in sizing the article such that the ultimate elongation of the gel is not exceeded when the article is placed over the substrate. In the case where the gel is made of a polysiloxane material, a suitable adhesive for securing the gel to the member is a silicone pressure sensitive adhesive.

In operation, the article 1 as described is disposed over the substrate 2 and placed thereon such that the protective gel 10 is deformed so as to take on a shape roughly illustrated by the dotted line 14 in FIG. 1. One embodiment is to provide a small air escape hole to provide a means for air release from cavity 23 between the member 4 and gel 10 as the cavity 23 contracts in volume upon installation of the article 1.

It should be understood the hole 21 is not required. Without the hole 21, air confined within the cavity 23 which contracts upon installation of the article 1 can escape between the periphery 13 of the member 4 and the gel 10 after which the gel, due to its tackiness, re-adheres and seals to the periphery 13. With this construction, atmospheric pressure contributes to maintaining the member 4 in its installed position since removal of the member 4 subsequent to installation requires that the volume of the cavity 23 be enlarged which results in a pressure decrease in the cavity 23 whereas pressure outside the member 4 and cavity 23 remains constant thereby creating a pressure differential therebetween.

Even though the elastic deformation of the gel produces a small force tending to push the article off the substrate, several means are available for preventing this from occurring even if the article is subjected to other external, possibly larger forces, e.g., vibrations. First, if the hole 21 is not provided, as already explained, atmospheric pressure forces would keep the article installed and in place. In addition, the tackiness of the gel also produces a retention force since it is in contact with the substrate and adheres and seals thereto. If the hole 21 is provided, the tackiness of the gel can be made so as to produce sufficient retention forces. In addition, grooves and recesses 16 for engaging threads 17 can be formed on an inner surface of the member 4. If a substrate not having threads is to be protected, it will be apparent to those skilled in the art that the member 4 may be able to be shaped so as to closely conform in shape to the substrate so as to produce a retention force like that obtained with grooves and recesses which mate with threads, e.g. such as for example grooves and recesses formed on the member 4 which closely conform in shape to similar grooves and recesses on the substrate. Also, the member 4 can be sized so as to form a close fit around at least selected portions of the substrate when installed, and if the material of the member 4 is slightly elastic, it is even possible to size the fit such that the member is caused to stretch around the substrate upon installation which creates relatively large frictional engagement forces therebetween. Any combination of the above is possible when external forces, which may otherwise tend to dislodge the article 1 from the substrate, are anticipated.

Accordingly, it can be appreciated that the article 1 can be made to remain in place and to provide good environmental protection means for the substrate 2 such that it is protected from adverse environmental contaminants, such as water or other corrosion-producing substances. In addition, if desired, the article 1 is suitable for protecting substrates 2 from electrical currents, e.g., the article 1 can have a gel 10 which is electrically insulating.

FIGS. 3–6 illustrate further embodiments of the invention. In FIG. 3, the substrate 32 comprises pipes or hoses 32 interconnected by a fitting 33, and the article 34 comprises first and second parts 31, 31, each comprising a preformed member 4 and gel 10. The parts 31 are assembled as shown in FIG. 4. The tackiness of the gel can be used to keep the parts 31 interconnected, and/or mechanical clamps 36, either integrally formed with the parts 31 or separately attached, can also be used. In FIGS. 5 and 6, the parts 1 are interconnected on one side by a hinge 35, this embodiment further illustrating the mechanical clamp 36.

For more complicated structured substrates, it can be appreciated that any number of the parts 31 in excess of two can be formed so as to be mutually engagable and provide a complete environmental seal for the complicated structured substrate.

FIG. 7a illustrates another preferred embodiment of the invention. In FIG. 7a, an article 11 is formed such that the gel 10 is in intimate contact with the internal surface 6 of the member 4. This embodiment is advantageous in that any risk of the gel tearing by being stretched upon being installed onto the substrate 2 is eliminated since the gel of FIG. 7a is not substantially deformed by the installation process. Reference numeral 62 denotes a release sheet disposed onto the gel so as to cover an otherwise exposed surface of the gel. In FIG. 7b, the release sheet 9 is disposed across the open side of the deformed backing subsequent to its deformation.

FIG. 8 illustrates one preferred process of producing the article of FIG. 7, this method being adaptable to continuous production. According to this process, a backing 50 is preferably continuously transported from a roll 51 past a gel dispenser 52 having uncured gel 10 therein, past a doctor blade 54, past a beam 56 for curing and crosslinking the gel to give it desired properties (such as a desired cone penetration, elongation, elasticity, tackiness, etc.), past a thermoforming station 58 which heats the cured gel and backing and forms it into a desired shape 64, past a release sheet dispenser 60 which dispenses a release sheet 62 across an open side of the thermoformed shape 64, and finally to a die cut station 66 which separates the thermoformed shapes 64 which then correspond to the articles 11.

In this embodiment, the beam 56 crosslinks and cures the gel, and further functions to adhere the gel to the backing 50 by crosslinking the gel where it contacts the backing. Alternatively, a separate beam 57 can be utilized to crosslink the gel contacting the backing, the separate beam 57 radiating the backing and gel through a surface of the backing opposite the gel. The beams 56, 57 can comprise electron beams and/or ultraviolet beams, and the intensity of and dose of radiation is determined to obtain optimum adhesion between the backing and the gel, and to achieve optimum and desired gel properties.

As an alternative to radiation for curing the gel, chemical crosslinking agents can be utilized and mixed with the uncured gel for curing the gel. In addition, if desired, chemical crosslinking agents can be used to also crosslink the gel to the backing and secure it thereto. Alternatively, an adhesive can be used to secure the gel to the backing rather than radiation or chemical crosslinking agents. When the gel comprises a polysiloxane material, a suitable adhesive is a silicone pressure sensitive adhesive.

Another alternative embodiment is illustrated in FIG. 9 wherein a cured gel is applied to the backing rather than an uncured gel as illustrated in FIG. 8.

In the embodiment of FIG. 9, the cured gel can be applied as part of and embedded within a three dimensional matrix having characteristics as described above with reference to the embodiment of FIG. 1, or can be applied as a unitary layer. According to these additional embodiments, the cured gel can be secured to the backing using adhesives, or radiation as illustrated, as described in the embodiment of FIG. 8. If radiation is used, the kind of radiation used and its direction of application (e.g. from the backing side or the gel side) are optional, though it should be understood that the radiation may cause additional crosslinking in the gel, especially if applied from the gel side, and this should be considered in formulating the cured gel which is to be disposed on the backing. In Figure 9, since the gel is precured, a doctor blade is not needed, and this embodiment illustrates radiation grafting of the gel to the backing, though it should be understood that chemical grafting could be used instead. Also, this figure illustrates dispensing the release sheet 62 onto the exposed surface of the gel subsequent to dispensing the gel but prior to the thermoforming operation, which produces the article of FIG. 7a, rather than the article of 7b produced when the release sheet is applied subsequent to thermoforming.

The thermoforming station 58 heats the cured gel and backing, and subjects the heated gel and backing to a vacuum pressure (which may be augmented by pressure from the above side) within a chamber 59 having a shape corresponding to a final desired shape of the article 11, 64 such that the gel and backing are deformed into the shape of the chamber 59. In addition to pressure, mechanical means can also be utilized to deform the cured gel and backing, numerous kinds and types of deforming pressures and mechanical means being known in the art for thermoforming processes. The thermoformed shape 64 thus created is cooled. A material of the backing is chosen such that its physical integral strength in its cooled state produces forces tending to maintain this shape which are greater than elastic forces generated by the gel when stretched and deformed by the thermoforming station 58 such that the article remains in the thermoformed shape subsequent to being cooled. Typical materials suitable for the backing include high density polyethylene, kynar, polycarbonate, etc.

Though the invention has been described with reference to particular preferred embodiments thereof, it should be appreciated that numerous modifications thereto can be made within the level of skill of the ordinary skilled artisan. For example, the invention is suitable for protecting a wide variety of types of substrates as well as shapes thereof, and is not specifically limited only to bolts, nuts, and pipe fittings, these substrates being described only for illustrative purposes. In addition, by utilizing plural parts 31 as described, it can readily be appreciated that a large degree of freedom is possible in utilizing the invention for protecting a vast array of different types of substrates having various shapes, and the number of preformed members having gel disposed thereon can vary and exceed one or two per substrate when the irregular or unique shape of the substrate makes the use of multiple members in excess of two more practicable. In addition, though several preferred means are described for producing the unique articles of the invention in a continuous manner, it should be appreciated that many variations to the methods described are possible. Accordingly, the invention is not to be limited by the various specific embodiments described, and is to be limited only by the appended claims.

We claim:

1. A method of making an article for protecting a substrate, comprising:
    transporting a backing material past a gel dispenser;
    dispensing a gel from the gel dispenser onto the backing; and deforming the backing and the gel into a predetermined shape such that at least a major portion of an inner surface of the backing has gel thereon, the shape being similar to an external surface shape of at least part of a substrate to be protected.

2. The method as claimed in claim 1, the gel dispenser dispensing a non-cured gel onto the backing, and further comprising the step of curing the dispensed gel prior to deforming the backing.

3. The method as claimed in claim 2, further comprising the step of securing the gel to the backing prior to deforming the backing such that the gel stretches and sticks to the backing when deforming the backing.

4. The method as claimed in claim 3, the backing being continuously transported, the deformed backing being severed from a remainder of the backing subsequent to its deformation.

5. The method as claimed in claim 3, the backing being made from a material selected from the group of materials consisting of high density polyethylene, kynar, and polycarbonate.

6. The method as claimed in claim 2, the gel being tacky subsequent to being cured, and further comprising the step of covering an open side of the deformed backing with a release sheet.

7. The method as claimed in claim 2, the gel being cured by utilizing a chemical agent.

8. The method as claimed in claim 2, the gel being cured by radiation, the radiation being beta particles or ultraviolet radiation.

9. The method as claimed in claim 1, further comprising the step of securing the gel to the backing such that the gel stretches and sticks to the backing when the backing is deformed, the gel being secured to the backing by radiating an interface between the gel and the backing.

10. The method as claimed in claim 9, the radiation used for securing the gel to the backing being beta particles or ultraviolet radiation.

11. The method as claimed in claim 3, the gel being secured to the backing by an adhesive.

12. The method as claimed in claim 1, the backing being deformed such that the gel is stretched as the backing is deformed, a material from which the backing is composed having sufficient structural strength subsequent to its deformation to keep the gel in its stretched state.

13. The method as claimed in claim 1, the gel being disposed on the backing in a cured state.

14. The method as claimed in claim 13, the cured gel being disposed in a flexible matrix prior to being disposed onto the backing.

15. The method as claimed in claim 14, the flexible matrix comprising a material having a plurality of open interstices having an average volume of less than 0.01 inch$^3$, the gel including a plurality of interconnected segments which lie within the interstices of the matrix.

16. The method as claimed in claim 15, the matrix and the impregnant being such that when the gel and the matrix are stretched, the matrix reaches its ultimate elongation before the gel reaches its ultimate elongation.

17. The method as claimed in claim 1, further comprising the step of disposing a release sheet over an open side of the deformed backing subsequent to its deformation.

18. The method as claimed in claim 1, further comprising the step of disposing a release sheet onto an exposed surface of the gel subsequent to dispensing the gel and prior to deforming the gel.

* * * * *